United States Patent [19]
Lojek

[11] Patent Number: 5,635,422
[45] Date of Patent: Jun. 3, 1997

[54] DIFFUSING DOPANTS INTO A SEMICONDUCTOR WAFER

[75] Inventor: Bohumil Lojek, Mesa, Ariz.

[73] Assignee: Motorola, Inc., Schaumburg, Ill.

[21] Appl. No.: 844,315

[22] Filed: Mar. 2, 1992

[51] Int. Cl.$^6$ ............................................. H01L 21/223
[52] U.S. Cl. ............................................................. 438/567
[58] Field of Search ....................................... 437/950, 165, 437/168, 169; 148/DIG. 144

[56] References Cited

U.S. PATENT DOCUMENTS 4,588,455  5/1986  Genser ..................... 437/168

FOREIGN PATENT DOCUMENTS 8704006  7/1987  European Pat. Off. .......... 437/168
64-45118  2/1989  Japan ........................... 437/168

OTHER PUBLICATIONS

Kim et al, "Formation of Shallow Phosphorus Layers by Rapid Thermal Processing Using a Solid Diffusion Source", Journal of the Korean Institute of Electrical Engineering, vol. 1, No. 2, pp.105–109, 1988.

*Primary Examiner*—Chandra Chaudhari
*Attorney, Agent, or Firm*—Joe E. Barbee; Bruce T. Neel

[57] ABSTRACT

Dopants from a diffusion source (16) are diffused into a product wafer (14) to form a uniform doping concentration within the product wafer (14). The source (16) has a thermal conductivity that is approximately equal to a thermal conductivity of the wafer (14). The source (16) is positioned near the wafer (14) thereby forming a space (23) between the source (16) and the wafer (14). Gas flow (26) through the space (23) is limited to a predetermined value in order to prevent disturbing dopant diffusion. The source (16) is heated to a predetermined temperature, then the wafer (14) is heated. Subsequently, the wafer (14) and the source (16) are cooled at substantially equal rates.

20 Claims, 1 Drawing Sheet

DIFFUSING DOPANTS INTO A SEMICONDUCTOR WAFER

BACKGROUND OF THE INVENTION

The present invention relates, in general, to semiconductor processing methods, and more particularly to a novel method of diffusing dopants into a semiconductor wafer.

In the past, solid diffusion sources have been employed by the semiconductor industry as a source of dopants to be diffused into a semiconductor wafer. These prior diffusion sources generally are a disk shaped boron nitride or other ceramic material that contains a desired dopant. The solid diffusion source is typically placed near the semiconductor wafer, then the source and the wafer are heated to diffuse dopants from the source into the wafer.

One disadvantage of this prior method of using solid diffusion sources is thermal conductivity mismatch. Once diffusion is complete, the diffusion source and the wafer are cooled. Due to the thermal conductivity mismatch between the diffusion source and the wafer, the diffusion source cools at a slower rate than the wafer thereby preventing rapid cooling of the wafer. Consequently, dopants within the wafer continue to diffuse until the diffusion source cools. This uncontrolled diffusion generally results in a doping variation of between eight and ten percent across a semiconductor wafer. Such a nonuniform doping concentration is much higher than the desired variation of less than three percent.

In addition, these prior diffusion sources have a hydrophilic characteristic which results in a variable moisture content. Since thermal conductivity is a function of the moisture content, this hydrophilic characteristic further varies the thermal conductivity of these previous diffusion sources thereby further varying dopant concentrations across a semiconductor wafer.

In order to reduce contamination during the diffusion operation, the diffusion is typically performed while an inert gas flows between the diffusion source and the wafer. This gas flow disturbs the migration of dopants from the diffusion source through the gas to the wafer, and adds to the non-uniform doping concentration across the wafer.

Accordingly, it is desirable to diffuse dopants from a diffusion source into a semiconductor wafer by using a solid diffusion source that cools at a rate substantially equal to the semiconductor wafer, by using a solid diffusion source that is not hydrophilic, and by using a gas flow that does not disturb migration of dopants from the source to the wafer.

SUMMARY OF THE INVENTION

Briefly stated, the present invention includes diffusing dopants from a diffusion source into a product wafer. The source has a thermal conductivity that is approximately equal to a thermal conductivity of the wafer. The source is positioned near the wafer thereby forming a space between the source and the wafer. Gas flow through the space is limited to a predetermined value in order to prevent disturbing dopant diffusion. The source is heated to a predetermined temperature, then the wafer is heated. Subsequently, the wafer and the source are cooled at substantially equal rates.

DETAILED DESCRIPTION OF THE DRAWINGS

Figure 1:
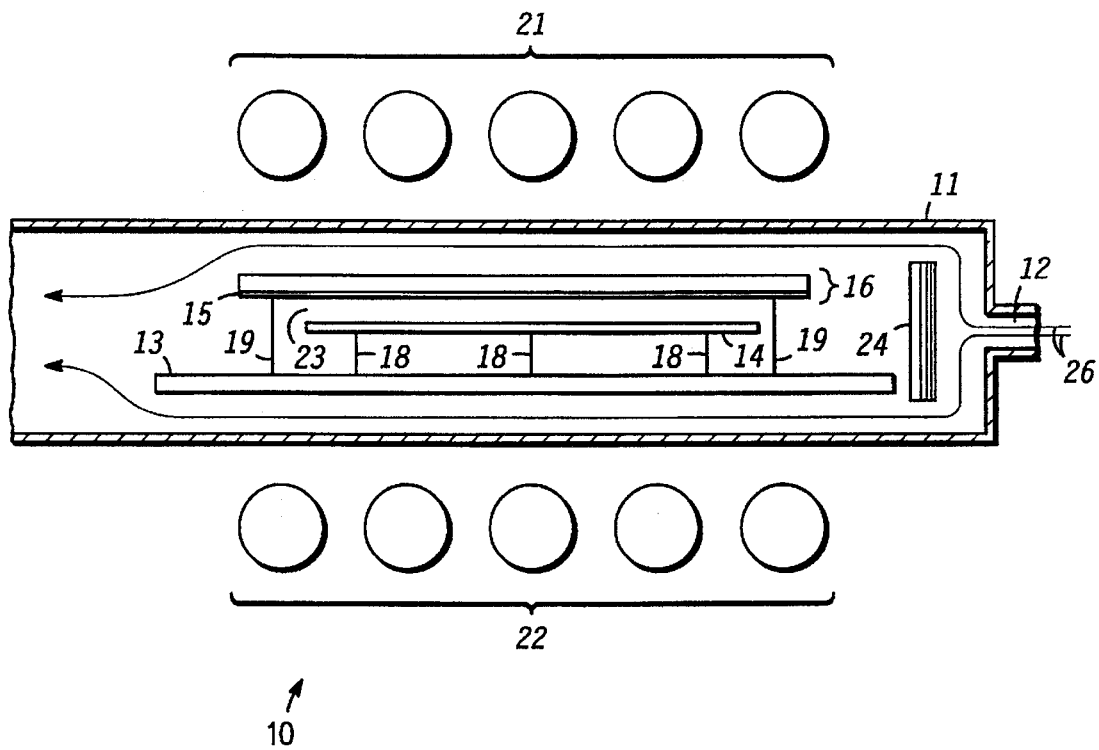
FIG. 1 illustrates a cross-sectional view of a diffusion apparatus in accordance with the present invention.

FIG. 1 illustrates a diffusion apparatus 10 that includes a solid diffusion source 16 and a gas flow distributor 24 that are useful in forming a uniform doping concentration across a product wafer 14. Source 16 is formed from a material that has a thermal conductivity which is substantially equal to the thermal conductivity of wafer 14. Consequently, source 16 and wafer 14 absorb and also dissipate thermal energy or heat at substantially equal rates. As will be seen hereinafter, this characteristic is useful in providing a uniform doping concentration across wafer 14. Source 16 includes a dopant layer 15 which provides dopants that will subsequently be diffused into wafer 14. Dopant layer 15 is formed by a variety of methods that are well known to those skilled in the semiconductor art including, but not limited to, a spin-on dopant layer, and a doped silicon dioxide layer such as borophosphosilicate glass. In the preferred embodiment, wafer 14 is a silicon wafer and source 16 is a silicon wafer that is covered with a spin-on dopant layer. In this embodiment, a variety of spin-on dopants that are well known to those skilled in the semiconductor art are suitable for layer 15. An example of one such spin-on dopant is known by the trademark "ACCUSPIN" from Allied Signal, Inc. of Milpitas, California.

Wafer 14 and source 16 are positioned on a wafer tray 13 so that dopant layer 15 is facing a surface of wafer 14 into which dopants will be diffused. Source 16 is supported by a plurality of quartz pins 19 while wafer 14 is supported by a plurality of quartz pins 18. Quartz pins 19 are longer than pins 18 in order to form a space 23 between wafer 14 and source 16. During subsequent heating of source 16 and wafer 14, dopants will diffuse or migrate from layer 15 through space 23 and into wafer 14. It is important that the dimensions of space 23 be well controlled since these dimensions are one factor that affect the dopant's diffusion depth into wafer 14. The smaller the height of space 23 the deeper dopants diffuse into wafer 14. In the preferred embodiment, space 23 has a height that is less than approximately one millimeter in order to form a diffusion depth of approximately 500 angsttoms (Å) into wafer 14. Tray 13, along with wafer 14 and source 16, is placed inside a diffusion tube 11 wherein the diffusion will be performed. Tube 11 has a gas inlet port 12 to allow an inert gas to enter and flow through tube 11 thereby minimizing contaminants within tube 11. The gas flow pattern is illustrated by a plurality of arrows 26. A gas flow distributor 24 is placed between inlet 12 and tray 13 in order to guide the gas flow around tray 13 and source 16. Consequently, distributor 24 limits the gas flow through space 23 thereby substantially eliminating disturbances to the dopants. Disturbances to the dopants within space 23 can be further reduced by minimizing the volume of tube 11 thereby minimizing the gas pressure and gas flow required to prevent contaminants from entering tube 11. In the preferred embodiment, tube 11 has a diameter which is approximately 3.0 millimeters larger than is required to accommodate tray 13, wafer 14, and source 16.

The perimeter of source 16 is formed to be larger than the perimeter of wafer 14 thus ensuring that source 16 completely overlaps the perimeter of wafer 14. It has been found that the overlap substantially eliminates slipping of the crystallographic planes and also reduces warping of wafer 14 during the heating and cooling cycles of diffusion operations. Consequently, this overlap configuration can prevent permanently damaging wafer 14. In the preferred embodiment, source 16 has a circular shape with a diameter that is approximately fifteen millimeters larger than the diameter of circular shaped wafer 14.

A doped region is formed within wafer 14 by heating only source 16 to a predetermined temperature that is suitable for diffusing dopants into wafer 14. This temperature diffuses dopants from layer 15 into space 23. Since wafer 14 is not heated during this operation, the dopants do not diffuse into wafer 14. Source 16 is maintained at the predetermined temperature until a thermal equilibrium condition is reached. In the preferred embodiment, the thermal equilibrium condition provides a temperature variation of less than approximately five degrees Celsius across source 16. Once thermal equilibrium is achieved, wafer 14 is heated to a predetermined diffusion temperature in order to diffuse the dopants from space 23 into wafer 14. In the preferred embodiment, source 16 is heated by a plurality of source heating lamps 21 to a temperature of between approximately 950 and 1100 degrees Celsius. Also in the preferred embodiment, wafer 14 is heated by a plurality of product heating lamps 22 to a temperature that is within plus or minus 20 degrees Celsius of source 16. The preferred embodiment substantially maintains wafer 14 at this temperature for a time period between approximately 40 and 50 seconds in order to form a shallow diffusion having a depth of approximately 500 Å into wafer 14. In this preferred embodiment, wafer 14 can be covered with a mask that prevents dopants from diffusing into various portions of wafer 14. Heating source 16 to thermal equilibrium before heating wafer 14, provides accurate control of the initiation of diffusion into wafer 14 and is one factor in forming a uniform doping concentration within wafer 14.

Once diffusion is complete, wafer 15 and source 16 are rapidly cooled to prevent further diffusion of dopants within wafer 14. Since source 16 and wafer 14 have substantially equal thermal conductivity, wafer 14 and source 16 cool at substantially equal rates. In the preferred embodiment, wafer 14 and source 16 are cooled at a rate of approximately 50 degrees Celsius/second. This rapid and substantially equal cooling minimizes uncontrolled diffusion of dopants within wafer 14 and facilitates forming a doping concentration that varies less than three percent across wafer 14.

Figure 2:
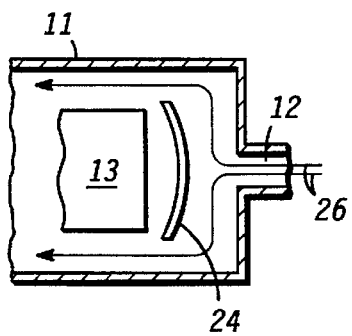
FIG. 2 illustrates a plan view of a gas flow distributor suitable for use with the apparatus of FIG. 1 in accordance with the present invention.

FIG. 2 illustrates a plan view of the preferred embodiment of distributor 24. For reference purposes, portions of tray 13, tube 11, and inlet 12 from FIG. 1 are also shown. In this preferred embodiment, distributor 24 is a semicircular or arc shaped section of quartz having dimensions that are approximately two millimeters less than tube 11. Arrows 26 illustrate the gas flow pattern that is formed as distributor 24 guides the gas away from space 23 (FIG. 1). Distributor 24 limits lateral gas flow through space 23 (FIG. 1) to less than 0.25 standard cubic cm/minute (SCCM).

By now it should be appreciated that there has been provided a novel way of diffusing dopants into a semiconductor wafer. Heating the diffusion source to thermal equilibrium prior to heating the product wafer facilitates controlling the initiation of dopant diffusion into the wafer. Utilizing a diffusion source that has a thermal conductivity which is substantially equal to the product wafer facilitates cooling the source and the wafer at substantially equal rates thereby providing a substantially uniform doping concentration across the product wafer. Employing a gas flow distributor to limit gas flow through the space between the source and the product wafer further improves the uniformity of the doping concentration.

I claim:

1. A method of diffusing dopants into a semiconductor wafer comprising:

forming a dopant layer on a first surface of a diffusion source by applying a spin-on dopant to the first surface, the diffusion source having a first thermal conductivity;

positioning the diffusion source a predetermined distance from a product wafer having substantially the first thermal conductivity thereby creating a space between the dopant layer and the product wafer wherein the product wafer is smaller than the diffusion source and a first surface of the product wafer faces the dopant layer;

limiting a flow of a gas through the space to a predetermined flow rate while permitting the gas to flow across a second surface of the product wafer and across a second surface of the diffusion source;

heating the diffusion source to a predetermined temperature wherein the predetermined temperature causes dopants to diffuse from the dopant layer into the space;

maintaining the diffusion source at substantially the predetermined temperature until the diffusion source reaches thermal equilibrium;

heating the product wafer to substantially the predetermined temperature and diffusing the dopants from the space a predetermined depth into the product wafer thereby forming a doped area having a predetermined doping concentration variation across the product wafer; and cooling the diffusion source and the product wafer at substantially equal rates.

2. The method of claim 1 wherein positioning the diffusion source the predetermined distance from the product wafer includes positioning the diffusion source less than 1.0 millimeters from the product wafer.

3. The method of claim 1 wherein limiting the flow of the gas through the space to the predetermined flow rate includes limiting the flow of the gas to less than approximately 0.25 standard cubic cm/minute.

4. The method of claim 1 wherein the limiting the flow of the gas step includes placing a gas flow distributor between the space and a gas inlet port wherein the gas flow distributor blocks a portion of the gas from the space.

5. The method of claim 4 wherein placing the gas flow distributor includes placing a quartz gas flow distributor having an arc shape.

6. The method of claim 1 wherein the heating the product wafer step includes having a doping concentration variation of less than three percent across the product wafer.

7. The method of claim 1 wherein the positioning the diffusion source step includes positioning the diffusion source having a diameter that is approximately fifteen millimeters larger than a diameter of the product wafer.

8. A method of forming uniform shallow diffusions in a semiconductor wafer comprising:

providing a product wafer having a predetermined thermal conductivity;

positioning a diffusion source having substantially the predetermined thermal conductivity a predetermined distance from the product wafer thereby creating a space between the product wafer and the diffusion source;

limiting a flow of a gas through the space to a predetermined gas flow rate while forming a higher gas flow rate outside of the space;

heating the diffusion source to a predetermined temperature;

maintaining the diffusion source at substantially the predetermined temperature until the diffusion source substantially reaches thermal equilibrium;

heating the product wafer substantially to the predetermined temperature thereby diffusing dopants from the doping source a predetermined distance into the product wafer; and cooling the diffusion source and the product wafer at substantially equal rates.

9. The method of claim 8 wherein positioning the diffusion source includes positioning a silicon wafer having a spin-on dopant applied to a surface of the wafer.

10. The method of claim 8 wherein limiting the flow of the gas through the space includes placing a gas flow distributor between the space and a gas inlet port.

11. The method of claim 10 wherein placing the gas flow distributor includes placing an arc shaped gas flow distributor that is formed from quartz.

12. The method of claim 8 wherein limiting the flow of the gas through the space includes limiting the flow of an inert gas.

13. The method of claim 8 wherein positioning the diffusion source having substantially the predetermined thermal conductivity the predetermined distance from the product wafer includes positioning a diffusion source having a periphery that is larger than a periphery of the product wafer.

14. The method of claim 8 wherein the heating the product wafer step includes diffusing the dopants from the doping source approximately 500 angstroms into the product wafer.

15. The method of claim 8 wherein cooling the diffusion source and the product wafer at substantially equal rates includes cooling the diffusion source and the product wafer at approximately fifty degrees Celsius per second.

16. A method of diffusing dopants into a semiconductor wafer comprising:

providing a product wafer having a predetermined thermal conductivity;

positioning a diffusion source having substantially the predetermined thermal conductivity a predetermined distance from the product wafer thereby creating a space between the product wafer and the diffusion source;

limiting gas flow through the space to a predetermined value;

heating the diffusion source to a predetermined temperature;

maintaining the diffusion source at the predetermined temperature until reaching thermal equilibrium;

heating the product wafer; and cooling the diffusion source and the product wafer at substantially equal rates.

17. The method of claim 16 wherein positioning the diffusion source includes positioning a silicon wafer having a dopant layer on a surface of the silicon wafer.

18. The method of claim 16 wherein positioning the diffusion source includes positioning the diffusion source having a periphery that is larger than a periphery of the product wafer.

19. The method of claim 18 wherein positioning the diffusion source having the periphery that is larger than the periphery of the product wafer includes positioning the diffusion source having a diameter that is approximately fifteen millimeters larger than a diameter of the product wafer.

20. The method of claim 16 wherein cooling the diffusion source and the product wafer at substantially equal rates includes cooling the diffusion source and the product wafer at approximately fifty degrees Celsius per second.

* * * * *